United States Patent [19]

Presnick

[11] 4,078,847

[45] Mar. 14, 1978

[54] ELECTRONIC EQUIPMENT ENCLOSURE

[76] Inventor: Michael C. Presnick, % Metatronics Mfg. Corp, 111 Blomingdale Rd., Hicksville, N.Y. 11801

[21] Appl. No.: 685,310

[22] Filed: May 11, 1976

[51] Int. Cl.² .............................................. F16B 7/00
[52] U.S. Cl. .................................. 312/140; 312/111; 312/263; 403/171
[58] Field of Search ......... 312/140, 111, 263, 257 SK, 312/257 SM; 403/72, 171; 52/758 H, 170

[56] References Cited

U.S. PATENT DOCUMENTS

| 424,554 | 4/1890 | Hofman | 312/140 |
|---|---|---|---|
| 1,620,737 | 3/1927 | Peterson | 312/140 |
| 2,588,818 | 3/1952 | Franks | 52/758 H |
| 3,085,841 | 4/1963 | Snyder | 312/140 |
| 3,353,854 | 11/1967 | Hansen | 403/171 |
| 3,525,560 | 8/1970 | Gasner et al. | 312/263 |
| 3,767,237 | 10/1973 | Suchowski | 403/171 |
| 3,784,043 | 1/1974 | Presnick | 52/758 H |
| 3,870,389 | 3/1975 | Killam | 312/111 |
| 3,955,702 | 5/1976 | Lundy | 52/758 H |
| 3,981,067 | 9/1976 | Oiler | 52/758 H |

FOREIGN PATENT DOCUMENTS 2,313,342  7/1974  Germany .......................... 312/140 R

*Primary Examiner*—Paul R. Gilliam
*Assistant Examiner*—Victor N. Sakran

*Attorney, Agent, or Firm*—Mandeville and Schweitzer

[57] ABSTRACT

The disclosure relates to an electronic equipment enclosure assembled from four basic components including (a) frame rail members, (b) corner connector clips, (c) panel support clips, and (d) panel sheets. The frame members each include a pair of right angled walls terminating at flanges which form adjacent pairs of parallel, longitudinally extending internal and external slots. The internal slots receive the clips of the invention, namely, unique, simply constructed connector clips at the mitered joints to fasten the frame members in an assembled mutually perpendicular relation, and panel corner connector clips to engage and support the wall panels and/or shelves of the enclosure. The novel corner connector clip is generally dish shaped and comprises three extending arm members disposed in planes in a mutual perpendicular relation. Each corner connector arm of eight connector clips is adapted to be inserted into the internal slots of the mitered ends of twelve rails to establish mitered, three dimensional corner joints in the assembly of a parallelpiped skeletal frame. Specifically, each connector arm includes a formed recess portion having an angularly disposed threaded hole formed therein to receive a fastening jackscrew whereby the fastening screw may be tightened to engage the frame member to urge the lateral edges of the connector clip arms against the internal slot walls and at the same time to drive the frame member towards the mitered corner.

11 Claims, 8 Drawing Figures

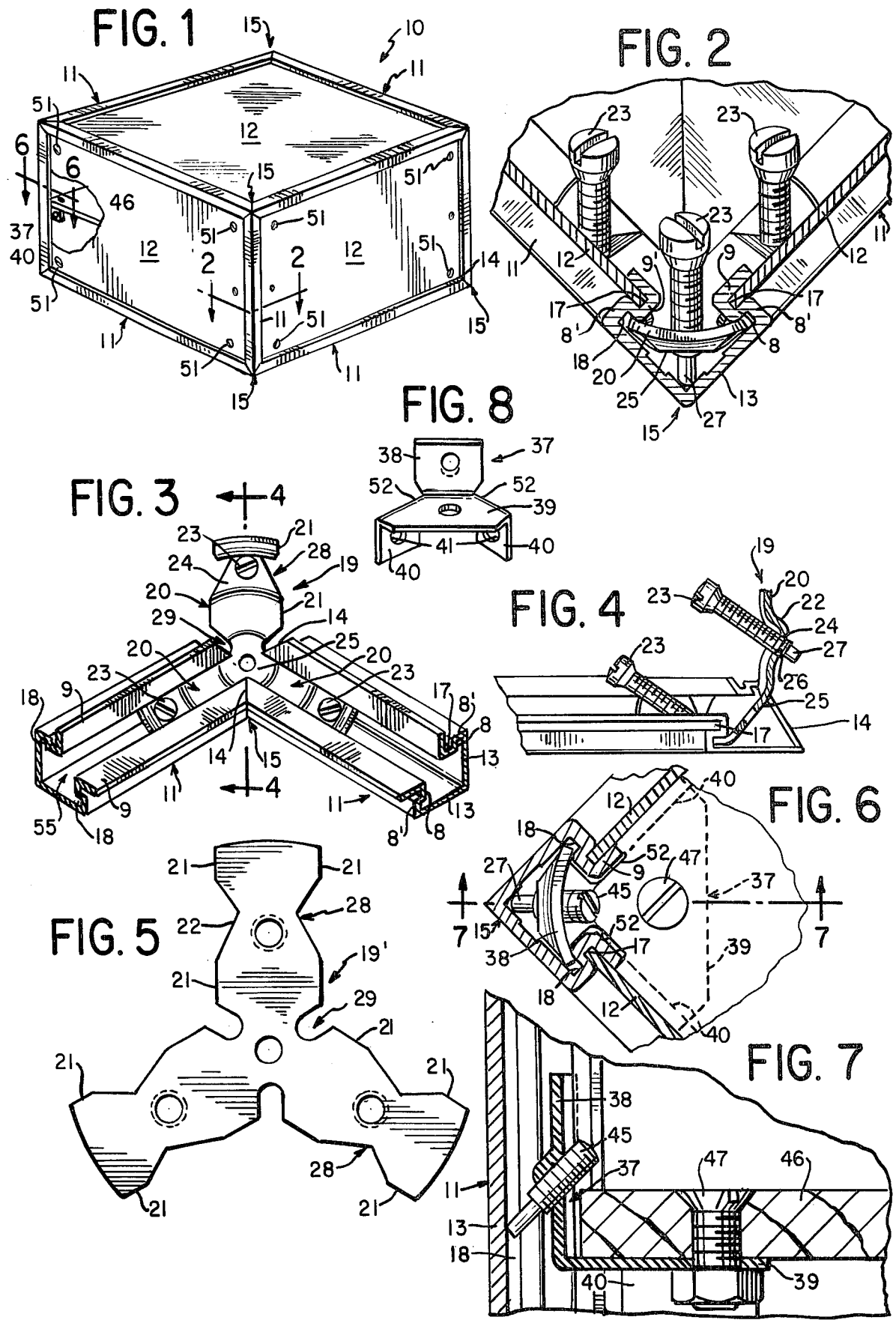

ELECTRONIC EQUIPMENT ENCLOSURE

BACKGROUND AND SUMMARY OF INVENTION

Electronic equipment enclosures are commonly constructed by assembling rigid frame members made of extruded aluminum at mitered corner joints. Typically, the frame members are of a hollow cross section. A corner block comprising two or more extending arms is usually employed to fasten adjacent frame members. The extending connector arms are arranged to be received into the hollowed internal portions of the frame members to provide interlocking engagement between adjacent frame members, thereby preventing lateral separation.

The prior art has heretofore proposed several mitered frame corner constructions employing three-legged connectors. Representative of such prior proposals are the Aschinger U.S. Pat. No. 2,371,493, Humble U.S. Pat. No. 3,144,365 and Suchowski U.S. Pat. No. 3,767,237. In each of these proposals three frame members are joined in a mitered joint with each of the frame members being disposed in perpendicular relationship with respect to the remaining members. The angularly extending arms of the connector are received within formed cavities provided in the adjacent ends of the angularly extending frame members.

Various fastenings including screws and rivets are utilized to securely fasten the connectors within the frame members to firmly hold the frame members in an assembled, mitered relation. Typically, where the frame members are made from extruded aluminum, a force-fitting connector is employed whereby the connector holds the frame member by a friction engagement.

As one of its basic objectives, the present invention seeks to provide an electronic equipment enclosure assembly incorporating a novel and improved mitered frame connection which may be easily and inexpensively constructed in any size from a standard set of components, namely, extruded framing rails, of unique cross section, sheet metal paneling, and two types of novel connector clips. Each of the unique connector clips disclosed herein is constructed from a single piece of sheet metal by a simple stamping and/or bending operation.

Generally, the new electronic equipment enclosure is constructed by assembling extruded aluminum frame rail members as mitered corners to form a parallelpiped skeletal framework. Each frame rail is of a hollow construction and comprises two lateral, longitudinally extending frame walls in right angled relation. The ends of the frame members are mitered at 45° angles so that contiguous frame members may be assembled into a mitered joint in known fashion.

Each of the new and improved frame rails includes a pair of spaced, parallel longitudinally extending inner and outer slots at each lateral edge thereof. The outer slots receive wall panels for closing off the equipment enclosure, while the inner slots receive the corner connector clips and the panel support clips.

Specifically, the inner slots cooperate with a new and improved dish-shaped, corner connector clip to securely fasten contiguous frame members at the mitered corners. The novel connector clip of the present invention comprises three extending arms in mutual perpendicular relation joined at a flat bottom of a dished central portion, which bottom is in a plane disposed at a 45° angle to each of the arms. The connector arms are loosely received in the inner slots of the frame walls for easy assembly. The edges of the connector arms engage the walls of the pairs of inner slots of each of the frame members and thereby tend to secure the frame members from transverse displacement at the mitered joint.

In accordance with the invention, the mid-region of each corner connector clip arm is bent to form a recessed portion. A threaded hole is formed in an inclined surface of the recess and a fastening jackscrew is threadedly received into the hole. After the connector arm is properly positioned in the frame member, the fastening jackscrew may be threaded to engage the frame member in an angled relation, whereby tightening of the fastening screw will also tend to drive the frame member towards the mitered corner and to establish a tight, firm mitered joint with the two adjacent rails.

As another feature of the present invention, a series of panel mounting clips is provided to mount both side walls and shelves to the parallelepiped skeletal frame. Typically, electronic equipment enclosures of the present type require shelves. Due to the great variety of size and shape of the equipment generally enclosed in such enclosures, it is advantageous to provide means to mount shelves in any desired position. Accordingly, each of the panel mounting clips comprises a frame rail engaging arm in right angled relationship to a gusset-like shelf supporting tab. The shelf tab is adapted to project at right angles to the frame rails into the interior equipment positions of the enclosure. The triangular shape allows the tab edges to extend into the plane of the edges of the innermost walls of the frame rails. A pair of winged portions project from the tab and are disposed to lie within the planes of the innermost rail walls. Therefore, the arrangement of the winged portions is such that when the panel mounting clip is inserted into the frame rail, the winged portions form extensions of the innermost lateral walls thereof. Side panels of sheet metal or the like may then be removably or permanently mounted to the equipment enclosure by appropriate fastening means connecting the panels to the winged portions of the mounting clips. The use of winged portions to mount the side panels rather than extended walls of the frame rail extrusions greatly reduces the bulk and weight of the frame rail members that would otehrwise be required, since the winged portions serve as extensions of the frame walls in only those regions where the side panel is intended to be secured to the frame.

The foregoing objects and advantages of the present invention will be further appreciated from a consideration of the following detailed description and accompanying drawings.

BRIEF DESCRIPTION OF THE DRAWINGS

FIG. 1 is a perspective view of an electronic enclosure embodying the principles of the present invention;

FIG. 2 is a cross-sectional view of a mitered corner joint incorporating features of the present invention and taken generally along the line 2—2 of FIG. 1;

FIG. 3 is a perspective view of the dished connector clip of the invention interlocking two frame members;

FIG. 4 is a cross-sectional view taken generally along the line 4—4 of FIG. 3;

FIG. 5 is a top plan view of a blank for the corner connector clip of the invention.

FIG. 6 is a cross-sectional view of the panel and shelf mounting clip of the present invention, taken along line 6—6 of FIG. 1;

FIG. 7 is a cross-sectional view taken generally along line 7—7 of FIG. 6; and

FIG. 8 is a perspective view of a panel mounting clip of the invention.

DETAILED DESCRIPTION OF THE PREFERRED EMBODIMENT

Referring now to the drawings and initially to FIGS. 1-5, the numeral 10 designates generally an electronic equipment enclosure comprising twelve frame rail members 11 and six sheet metal wall panels 12. The frame members 11 are extruded aluminum and in cross section (FIG. 2) are formed primarily by two lateral, longitudinally extending, mutually perpendicular walls 13. The ends 14 of the frame rail members 11 are cut at 45° angles in known manner so that they may be connected to form a mitered corner joint 15 (FIG. 3).

The primary walls 13 of the frame rails 11 cooperate with an intermediate parallel wall 8, and connecting wall 8' to form an external, longitudinally extending slot 17. Similarly, an internal, longitudinally extending slot 18 is formed by inner frame walls 9, connecting walls 9', and the intermediate wall 8. The side panels 12 of the enclosures 10 are received into the outer slots 17, as shown in FIG. 2, for permanent mounting, as will be described in detail hereinafter.

Each mitered corner joint 15 is formed by the joining of the ends 14 of three adjacent frame rails 11, with each rail 11 being disposed at a right angle to the plane defined by the remaining two rails. In accordance with the invention, the frame rail members 11 are held in an assembled relation by a unique, dished, one-piece corner connector clip, designated generally by the numeral 19. The connector clip 19 is conveniently manufactured from a specially pre-cut sheet metal blank 19' by a simple stamping operation, utilizing circular dish-shaped dies, which bends the connector into its final three-dimensional shape.

The connector clip 19 comprises three extending arms 20 defining X, Y, and Z axes, which are joined by a central flat portion 25 disposed in a plane at a 45° angle to the three arms. The arms 20 are inserted into the slots 18 of each frame member 11, as shown in FIG. 6. Each connector arm 20 may be slightly arcuate in cross section, as clearly illustrated in FIGS. 2 and 3; the lateral edges 21 of each arm 20 are smoothly received in the internal slots 18. The physical engagement between the walls of the internal slots 18 and the connector edges 21 secure the frame members against transverse displacement at the mitered joint 15. A recessed portion 22 is defined by a bend in the mid portion of the extending arm 20 and has an inclined surface 24. The surface 24 is provided with a centrally positioned threaded hole 26. Fastening jackscrews 23 are threadedly received in the holes 26 and screwed down into engagement with a complementary frame member 11 to firmly secure the connector clip 19 within the complementary frame member 11.

Due to the incline of surface 24, the fastening screw 23 will engage the frame member 11 at a driving angle. The end of the screw 23 is formed to a threadless engaging tip 27. The angle formed by the engaging tip 27 and the frame member 11, is such that engagement pressure of the fastening screw 23 will drive the frame member 11 towards the mitered joint 15 and thereby prevent longitudinal displacement and form a tight joint. Of course, the engagement pressure of the fastening screw 23 will also produce a tight friction engagement between the extending arms 20 and the walls of the internal groove 18.

The lateral edges of the corner connector arms 20 are provided with triangular shaped cutouts 28 which relieve bending stresses during formation of the connector and provides the requisite clearances for final assembly. Likewise, for ease of formation and to accommodate a tight abutment of the rails at the mitered joint 15, the connector clip 19 and the blank 19' include three U-shaped cutouts 29. As shown, the cutouts 29 allow the conjoining end portions of the frame member 11 to meet in an edge-to-edge, tight relationship and allow the clip to pass over the narrowed opening or throat portion 55 between walls 9 (FIG. 3).

To provide easy access to equipment enclosed within the enclosure 10, several of the side panels 12 are removably secured to the enclosure 10. Referring to FIGS. 6-8, a new and improved panel mounting clip 37 is shown. The panel mounting clip 37 is provided with a triangular gusset shaped shelf-support tab 39 integral with a support arm 38 and in a right angled relation thereto. In this manner, when the mounting clip 37 is secured to a frame member 11, the gusset tab 39 will extend into the enclosure 10 for mounting a shelf 46 by fastener 47, as shown in FIG. 7. The frame rail engaging arm 38 of the mounting clip 37 is, of course, inserted in the frame member 11 and received into the internal slots 18 to secure the mounting clip 37 against transverse displacement. The mounting clip 37 is secured against axial displacement by a fastening screw 45 which is similar to screws 23.

In accordance with the invention and in order to removably mount a side panel 12, the panel connector 37 is provided with winged portions 40 extending at right angles to the gusset tab 39. The winged portions 40 will form continuations of the inner rail walls 9 and slots 17 of the frame rail members in and against which the side panels 12 may be supported and removably secured. Cutouts 52 similar in function to the cutouts 29 are formed in the clips 37 to accommodate their insertion into the slots 18. The winged portion 40 include holes 41 in order that the side panels 12 may be secured thereto by means of an appropriate fastener.

From the foregoing, it will be appreciated that a simple parallelepiped electronic enclosure 10 may quickly and easily be assembled utilizing a plurality of panel mounting clips 37, which may be pre-assembled to pe-selected frame rail members 11; eight corner connector clips 19; six wall panels 12; and one or more shelf panels 46.

The electronic equipment enclosure disclosed herein provides an extremely practical means for enclosing and protecting electronic equipment and similar apparatus. Its various features facilitate easy and inexpensive assembly and afford great versatility for its intended use. While the particular enclosure described herein is a preferred embodiment of this invention, the invention is not limited to this particular arrangement and, as will be appreciated and understood by those skilled in the art, changes may be made without departing from the scope of the invention which is defined in the appended claims.

I claim:

1. An equipment enclosure comprising (a) twelve hollow, extruded framing rail members having mitered ends;
(b) said rail members including spaced, longitudinally extending internal slot means disposed in mutually perpendicular planes at the opposite lateral edges of said rail members;
(c) eight dish-shaped corner connector means;
(d) each of said corner connector means including three arms disposed along mutually perpendicular axes;
(e) the lateral side edges of each of said connector arms being disposed in mutually perpendicular planes and being adapted to engage internally said internal slot means of each of said rail members at said mitered ends to form eight miter joints;
(f) a plurality of fastening jackscrews;
(g) each of said connector arms including an angularly disposed threaded hole to receive one of said fastening jackscrews whereby the fastening jackscrew may be tightened to angularly engage the complementary rail member thereby urging the lateral side edges of the connector arm against the internal slot means and, at the same time urging the rail member toward said miter joint;
(h) a plurality of panel connector means;
(i) each of said panel connector means incuding a mounting arm having lateral side edges adapted to engage internally said internal slots of selected ones of said framing rail members;
(j) tab means integral with said mounting arms and extending in predetermined panel mounting planes;
(k) first fastening means securing said panel connector means to said rails;
(l) a plurality of panel means;
(m) second fastening means securing all of said panel means to said panel connector means.

2. The enclosure of claim 1, in which
(e) said rail members include external slot means formed adjacent to said internal slot means and extending parallel therewith;
(b) said external slot means being of predetermined width sufficient to receive and support a wall panel means.

3. The enclosure of claim 2, in which
(a) each of the sides of said rail members includes a primary wall means, intermediate wall means, and an inner wall means, all of which wall means are in parallel planes;
(b) each of said internal slot means being formed by said primary and intermediate wall means;
(c) said external slot means being formed by said intermediate and said inner wall means.

4. The enclosure of claim 3, in which
(a) said tab means is disposed in the plane of said inner wall means.

5. The enclosure of claim 4, in which
(a) said panel connector includes two tab means disposed in mutually perpendicular planes and cooperating with said inner wall means of said frame rails to form effective extensions thereof.

6. The enclosure of claim 1, in which
(a) each of said corner connector means is formed from a flat, precut, three-legged blank by circular dish-like die formation;
(b) said corner connector arms intersect with and are interconnected by a substantially flat planar web disposed in a plane at a 45° angle with each of the longitudinal axes of said connector arms.

7. The enclosure of claim 6, in which
(a) said planar web has relief cut out portions between each of said legs;
(b) the spacing of the inner ends of said cut out portions being less than the minimum spacing between said frame rail inner wall means to accommodate the insertion of said connector arms into said frame rail internal slots.

8. The enclosure of claim 1, in which
(a) said panel connector means includes a shelf supporting gusset tab;
(b) a pair of wall panel mounting tabs depend from the side edges of said gusset tab in mutually perpendicular planes.

9. The enclosure of claim 1, in which
(a) said first fastening means comprise jackscrews which act to fasten said corner connector means within said rail members and to urge the mitered ends of said rail members toward the mitered ends of adjacent rail members, thereby establishing a firm and tight mitered joint.

10. The enclosure of claim 8, which includes
(a) at least one shelf panel means disposed within said enclosure; and
(b) third fastening means securing said shelf panel means to said panel connector means.

11. In an equipment enclosure, a miter frame corner construction, which comprises
three hollow, extruded framing rail members having mitered, ends,
(b) said rail members including spaced, longitudinally extending internal slot means disposed in mutually perpendicular planes at the opposite lateral edges of said rail members,
(c) a dish-shaped corner connector means including three arms disposed in mutually perpendicular axes,
(d) the lateral side edges of each said connector arms being disposed in mutually perpendicular planes and being adapted to engage internally of the internal slot means of a complementary rail member at the mitered end,
(e) three fastening jackscrews,
(f) each of said connector arms including an angularly disposed threaded hole to receive one of said fastening jackscrews, whereby the fastening jackscrew maybe tightened to angularly engage the complementary rail member thereby urging the lateral edges of the connector arms against the internal slot means and, at the same time urging the rail member toward said miter frame corner.

* * * * *